United States Patent
Hsieh (10) Patent No.: US 8,217,422 B1
(45) Date of Patent: Jul. 10, 2012

(54) SEMICONDUCTOR DEVICES WITH GATE-SOURCE ESD DIODE AND GATE-DRAIN CLAMP DIODE

(75) Inventor: Fu-Yuan Hsieh, New Taipei (TW)

(73) Assignee: Force Mos Technology Co., Ltd., New Taipei (TW)

( * ) Notice: Subject to any disclaimer, the term of this patent is extended or adjusted under 35 U.S.C. 154(b) by 0 days.

(21) Appl. No.: 13/416,597

(22) Filed: Mar. 9, 2012

Related U.S. Application Data (60) Division of application No. 13/185,538, filed on Jul. 19, 2011, now Pat. No. 8,164,114, which is a continuation-in-part of application No. 12/453,631, filed on May 18, 2009, now Pat. No. 8,004,009.

(51) Int. Cl.
*H01L 29/66* (2006.01)

(52) U.S. Cl. ........ 257/173; 257/328; 257/333; 257/551; 257/E29.262; 257/E29.335; 438/140

(58) Field of Classification Search .............. 257/173, 257/328, 333, 551, E29.262, E29.335; 438/140
See application file for complete search history.

(56) References Cited

U.S. PATENT DOCUMENTS

6,825,504 B2 * 11/2004 Ishizuka et al. ............... 257/173
* cited by examiner

*Primary Examiner* — Tu-Tu Ho
(74) *Attorney, Agent, or Firm* — Bacon & Thomas, PLLC (57) ABSTRACT

A semiconductor power device integrated with a Gate-Source ESD diode for providing an electrostatic discharge (ESD) protection and a Gate-Drain clamp diode for drain-source avalanche protection. The semiconductor power device further includes a Nitride layer underneath the diodes and a thick oxide layer as an etching stopper layer for protecting a thin oxide layer on top surface of body region from over-etching.

6 Claims, 14 Drawing Sheets

SEMICONDUCTOR DEVICES WITH GATE-SOURCE ESD DIODE AND GATE-DRAIN CLAMP DIODE

CROSS REFERENCE TO RELATED APPLICATIONS

This application is a divisional application of pending U.S. patent application Ser. No. 13/185,538, filed Jul. 19, 2011 (of which the entire disclosure of the pending, prior application is hereby incorporated by reference). The parent application Ser. No. 13/185,538 is a continuation-in-part (CIP) of U.S. application Ser. No. 12/453,631 filed on May 18, 2009.

FIELD OF THE INVENTION

This invention generally relates to the cell structure and device configuration of semiconductor devices. More particularly, this invention relates to improved Gate-Source ESD (electrostatic discharge) protection and Gate-Source avalanche protection without having body region damage and punch-through issues induced in the fabricating process steps.

BACKGROUND OF THE INVENTION

Figure 1:
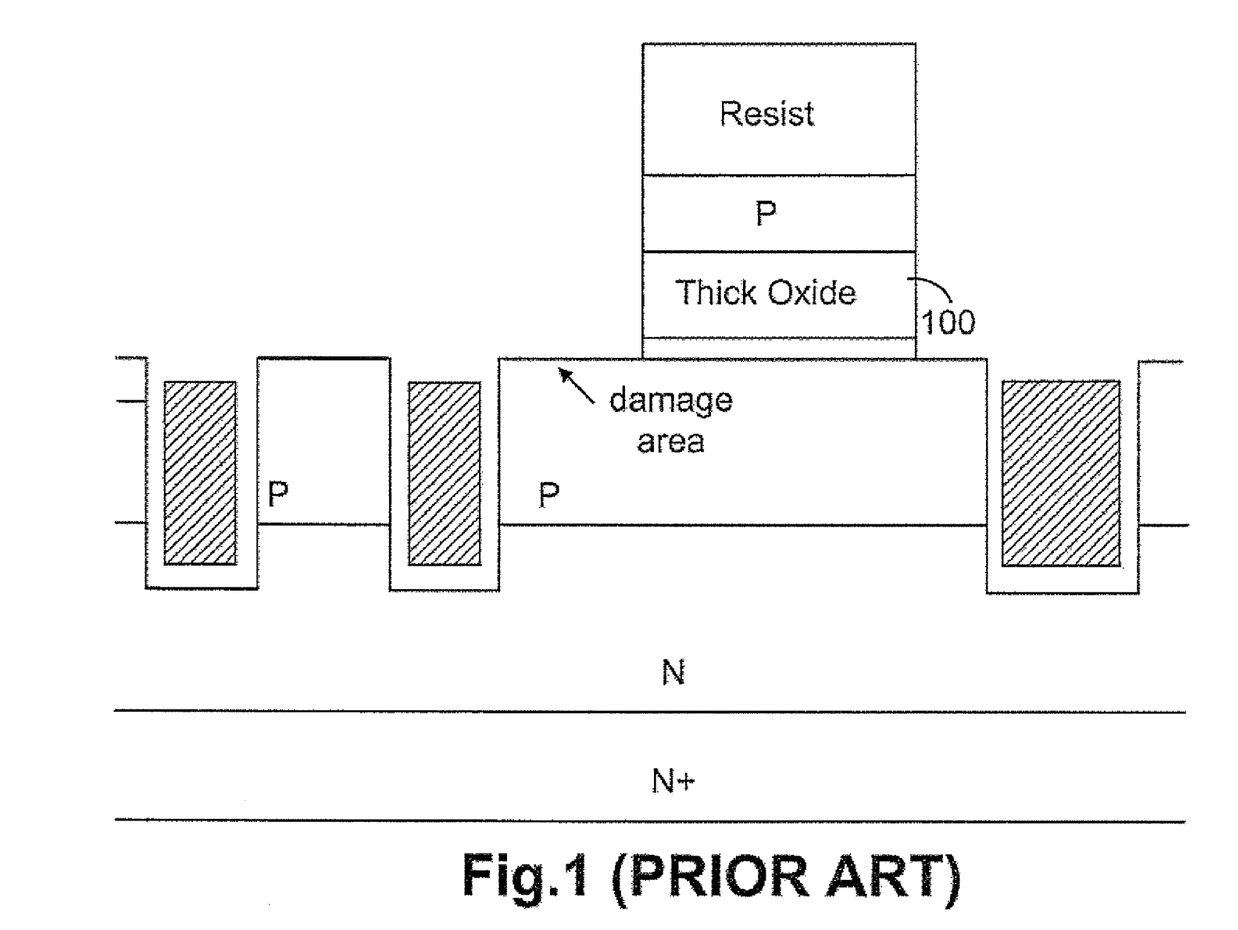
FIG. 1 is a side cross-sectional view of a prior art to illustrate the damage area caused by the dry oxide etch due to the lack of stopper layer.

In U.S. Pat. No. 6,413,822, for the purpose of providing over-voltage ESD protection, a Gate-Source ESD diode is formed at the peripheral area or gate pad area of a MOSFET device. The Gate-Source ESD diode is supported on a thick oxide layer 100 (as illustrated in FIG. 1) and includes an array of doped regions arranged as n+pn+pn+ regions. However, the prior art still has technical difficulties in dealing with the ESD problems in manufacturing. Specifically, damage of the gate oxide layer and the body region can easily be induced during the dry oxide etch to etch the thick oxide layer 100 prior to source ion implantation because there is no an etching stopper layer to protect the body region and channel region during the dry oxide etch process, therefore the device may suffer over-etch in gate oxide and the channel region, as shown in FIG. 1. On the other hand, it also may cause the body region damage when there is no screen oxide for the subsequent source ion implantation in the fabricating process. Even if the screen oxide for source ion implantation is grown, Boron dopant near the channel region will leach out during screen oxidation, which will cause punch-through issue.

Therefore, there is still a need in the art of the semiconductor device configuration, particularly for trenched power semiconductor design and fabrication, to provide a novel cell structure, device configuration and fabrication process that would resolve these difficulties and design limitations. Specifically, it is desirable to provide effective method to reduce a likelihood of device damages caused in fabricating process. In the meantime, it is also desirable to eliminate the problem caused by punch-through issue.

SUMMARY OF THE INVENTION

It is therefore an object of the present invention to provide a new and improved semiconductor power device configuration and manufacture method to solve the problems discussed above for better ESD protection.

One aspect of the present invention is that, a Nitride layer is formed onto a thin oxide layer before the deposition of a thick oxide layer. The extra Nitride layer acts as an etching stopper layer while etching the thick oxide layer, resulting no over-etching issue and protecting the thin oxide layer underneath, therefore preventing the body region damage from happening, as shown in FIG. 2B. At the same time, during source ion implantation, the thin oxide layer will act as the screen oxide layer for the source ion implantation because it isn't etched off when etching the thick oxide layer and the Nitride layer, therefore resolving the problems of the body region damage and the accordingly Boron leaching out, as shown in FIG. 6D.

Another aspect of the present invention is to provide improved semiconductor power device configuration having trench MOSFET device integrated with a Gate-Source ESD diode between a gate metal and a source metal for providing Gate-Source electrostatic discharge (ESD) protection, and a Gate-Drain clamp diode connected between the gate metal and a drain metal for drain-source avalanche protection on single chip. An insulation oxide layer comprising a separately formed thick oxide layer on top of a Nitride layer and thin oxide layer for completely insulating the Gate-Source ESD diode and the Gate-Drain clamp diode from a body region, the Nitride layer sandwiched between the thick oxide layer and the thin oxide layer functioning as dry oxide etching stopper for preventing body region damage from happening during dry etching of the thick oxide Another aspect of the present invention is to provide improved semiconductor power device configuration having trench IGBT device integrated with a Gate-Emitter (or Gate-Source, similarly hereinafter) ESD diode between a gate metal and an emitter (or source, similarly hereinafter) metal for providing Gate-Emitter ESD protection, and a Gate-Collector (or Gate-Drain, similarly hereinafter) clamp diode connected between the gate metal and a drain metal for collector-emitter avalanche protection on single chip. An insulation oxide layer comprising a separately formed thick oxide layer on top of a Nitride layer and thin oxide layer for completely insulating the Gate-Emitter ESD diode and the Gate-Collector clamp diode from a base (or body, similarly hereinafter) region, the Nitride layer sandwiched between the thick oxide layer and the thin oxide layer functioning as dry oxide etching stopper for preventing base region damage from happening during dry etching of the thick oxide.

Figure 4:
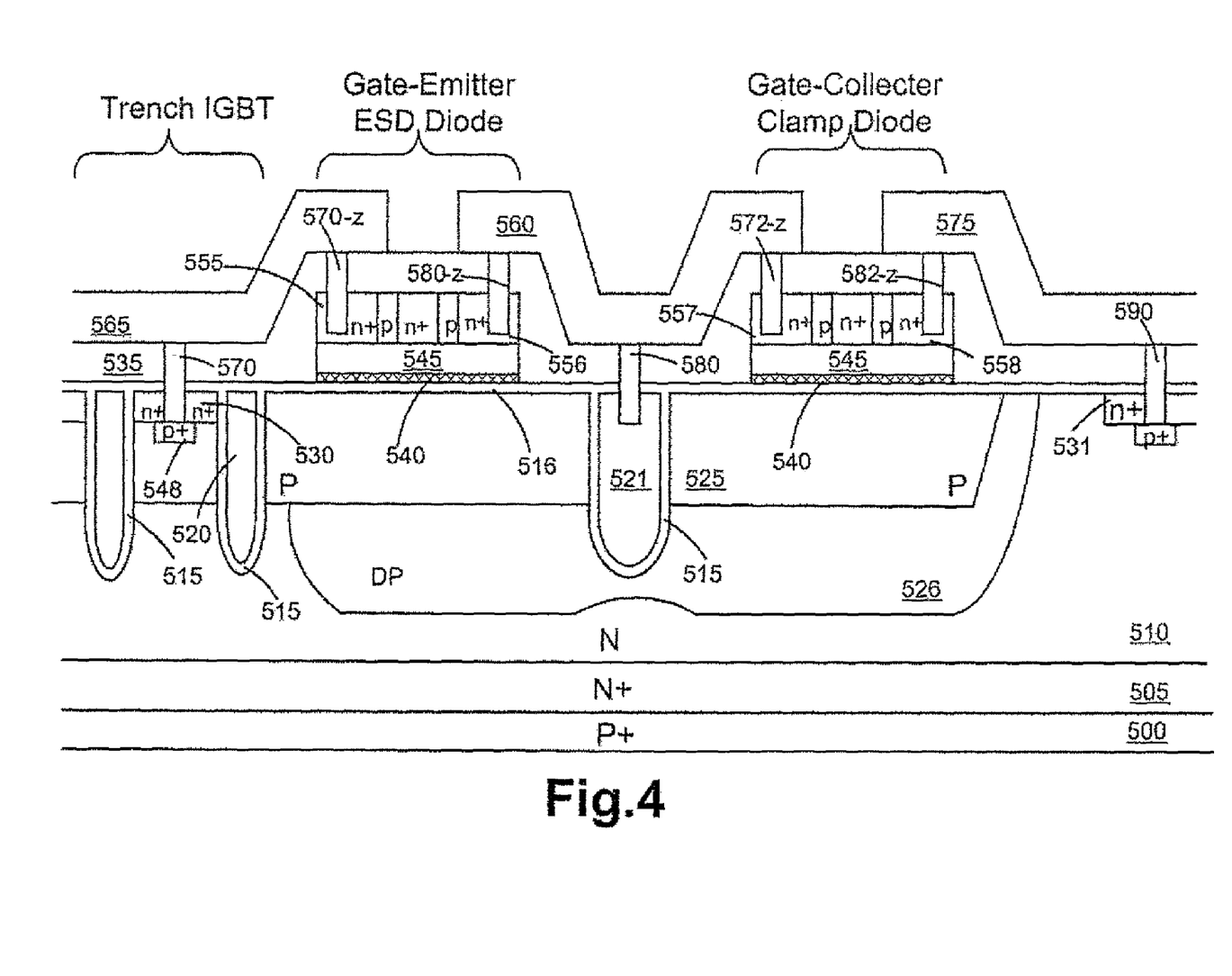
FIG. 4 is a side cross-sectional view of a trench IGBT integrated with a Gate-Emitter ESD diode and Gate-Collector clamp diode according to another preferred embodiment of this invention.

Briefly, in a preferred embodiment, as shown in FIG. 4, the present invention discloses a semiconductor power device cell MOSFET cell comprising: an epitaxial layer lightly doped with a first semiconductor doping type, e.g., N dopant, grown on a substrate heavily doped with the first semiconductor doping type; a plurality of trenched gates and at least a wider trenched gate for gate connection formed within the epitaxial layer and filled with doped poly over a gate oxide; body regions doped with a second semiconductor doping type, e.g., P dopant, extending between every two of the adjacent trenched gates with source region of the first semiconductor doping type near its top surface in active area; a Nitride layer formed onto a thin oxide layer; a thick oxide layer formed onto the Nitride layer; a Gate-Source ESD diode formed onto the thick oxide layer and composed of alternative n+pn+pn+ doping areas; a plurality of contact trenches penetrating a thick oxide interlayer and extending into the source region, the body regions, two electrodes of the Gate-Source ESD diode and the wider trenched gate, respectively; trenched contact plugs, for example Tungsten plugs, filled into all the contact trenches over a barrier layer of Ti/TiN or Co/TiN; a source metal connected with the source region, the body regions and one electrode of the Gate-Source ESD diode via a trenched source-body contact and one trenched. Gate-Source ESD diode electrode contact; a gate metal connected with the wider trenched gate and another electrode of the Gate-Source ESD diode via a trenched gate contact and another trenched Gate-Source ESD diode electrode contact; a p+ area underneath the bottom of each the trenched source-body contact to further reduce contact resistance; a Gate-Drain clamp diode formed onto the thick oxide layer and composed of alternating n+pn+pn+ doping areas; a plurality of contact trenches penetrating a thick oxide interlayer and extending into a drain region, two electrodes of the Gate-Drain diode, respectively; the trenched contact plugs filled into all the contact trenches over a barrier layer of Ti/TiN or Co/TiN; a drain metal connected with the drain region and one electrode of the Gate-Drain Clamp diode via a trenched drain contact and one trenched Gate-Drain clamp diode electrode contact; gate metal connected with the wider trenched gate and another electrode of the Gate-Drain clamp diode via trenched gate contact and another trenched Gate-Drain clamp diode electrode contact.

Briefly, in another preferred embodiment, there is provided an improved semiconductor power device configuration having trench MOSFET device integrated with a Gate-Source ESD diode and a doped poly-silicon resistor on single chip for providing Gate-Source ESD protection. An insulation oxide layer comprising a separately formed thick oxide layer on top of a Nitride layer and thin oxide layer for completely insulating the Gate-Source ESD diode and the doped poly-silicon resistor from a body region, the Nitride layer sandwiched between the thick oxide layer and the thin oxide layer functioning as dry oxide etching stopper for preventing body region damage from happening during dry etching of the thick oxide.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 2A:
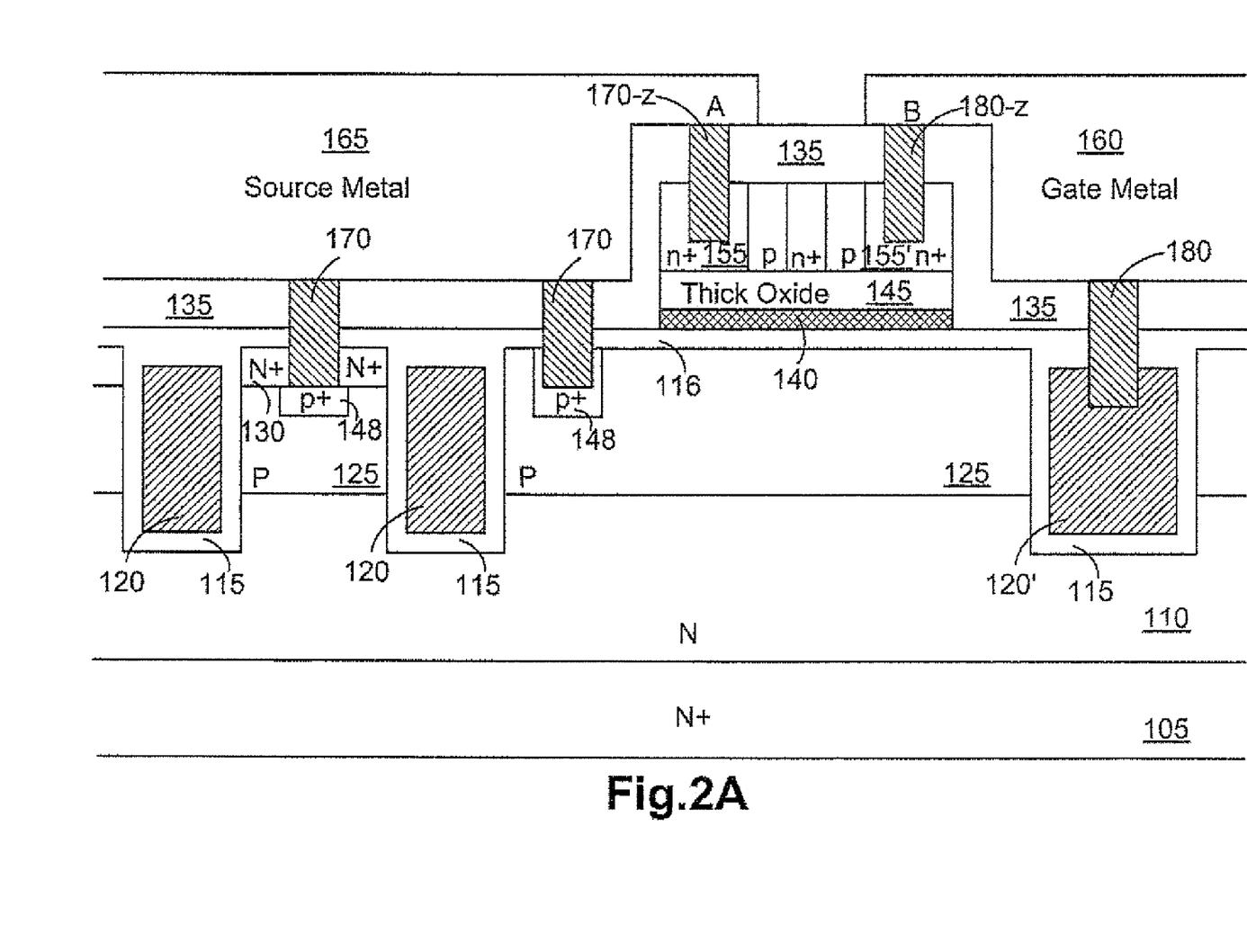
FIG. 2A is a side cross-sectional view of a MOSFET with a Nitride layer according to a preferred embodiment of this invention.
Figure 2B:
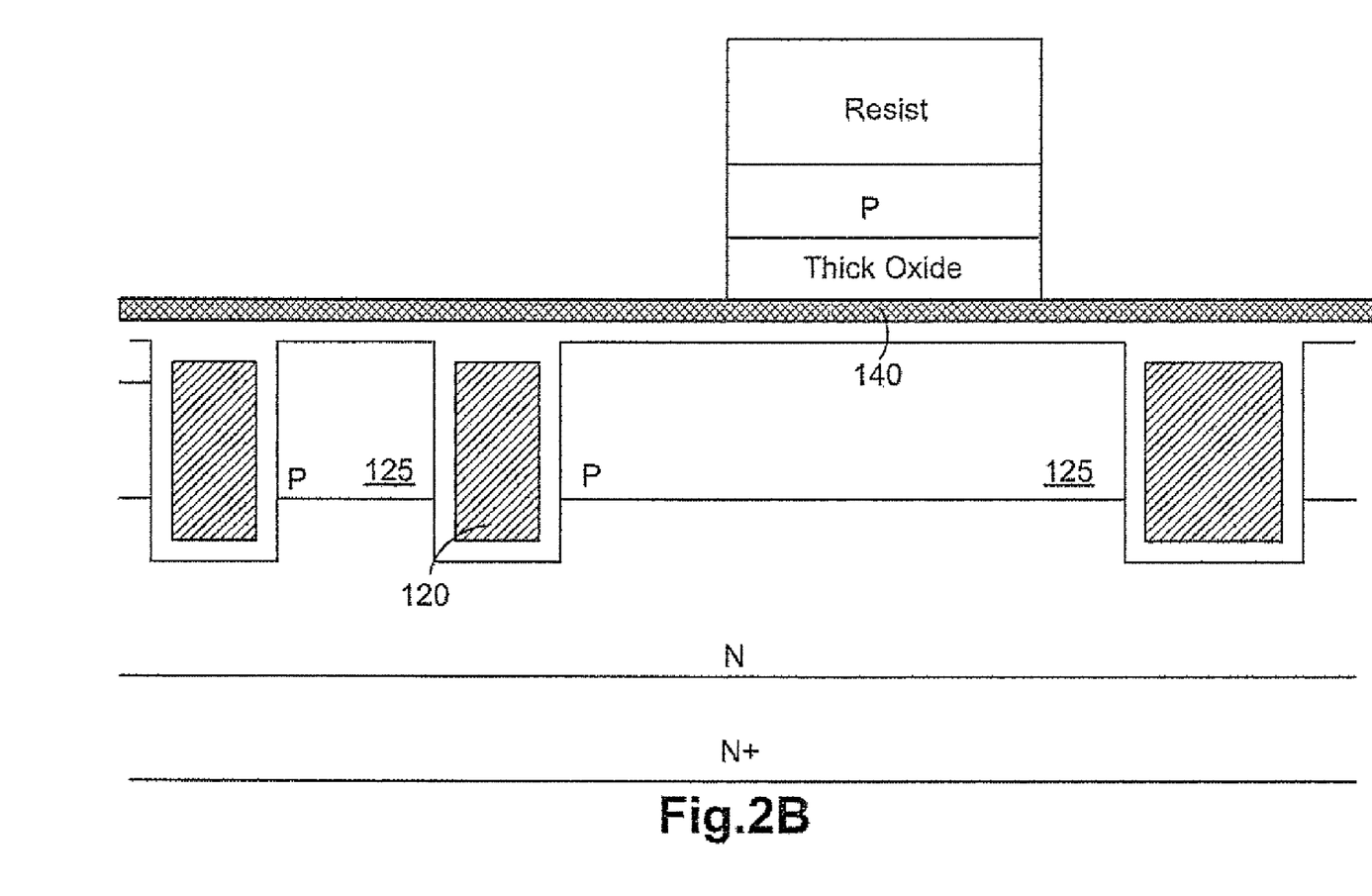
FIG. 2B is a side cross-sectional view for showing how the Nitride works as a stopper to protect the thin oxide underneath.

Please refer to FIG. 2A for a preferred trench MOSFET with a Nitride layer 140 according to the present invention. The trench MOSFET is formed on an N+ substrate 105 onto which grown an N epitaxial layer 110 with a lower concentration than the N+ substrate 105. A plurality of gate trenches and at least a wider gate trench for gate connection are etched into the N epitaxial layer 110. A doped poly-silicon layer is filled within those gate trenches over a gate oxide layer 115 to serve as a plurality of trenched gates 120 and at least a wider trenched gate 120' for gate connection. P-body regions 125 are extending between every two of the adjacent trenched gates 120 and 120' with an N+ source region 130 formed near its top surface within an active area. Onto a thin oxide layer 116 along the top surface of N epitaxial layer 110, the inventive Nitride layer 140 and a thick oxide layer 145, for example a CVD layer, is formed successively, and a Gate-Source ESD diode composed of alternative n+pn+pn+ doped regions is formed onto the thick oxide layer 145. Through a thick oxide interlayer 135 covering the thin oxide layer 116, the outer surface of the Gate-Source ESD diode, the thick oxide layer 145 and the Nitride layer 140, a plurality of contact trenches are etched into the N+ source region 130, the body region 125, one electrode 155 of the Gate-Source ESD diode, another electrode 155' of the Gate-Source ESD diode, and the wider trenched gate 120', respectively. Those contact trenches are filled with Tungsten plugs over a barrier layer of Ti/TiN or Co/TiN to act as trenched source-body contacts 170, trenched Gate-Source ESD diode electrode contacts 170-z and 180-z, and trenched gate contact 180, respectively. Via those trenched contacts, the N+ source region 130 and the body regions 125 as well as the electrode 155 of the Gate-Source ESD diode are connected with a source metal 165; the wider trenched gate 120' and the another electrode 155' of the Gate-Source ESD diode are connected with a gate metal 160. Especially, underneath each bottom of the trenched source-body contacts 170, there is a p+ area 148 to further reduce the contact resistance between the P body regions 125 and the metal plugs.

FIG. 2B is a fabricating step for showing how the Nitride layer 140 works as an etching stopper layer to protect the P body region 125 and the channel region near the trenched gate 120 during a dry oxide etch process.

Figure 3A:
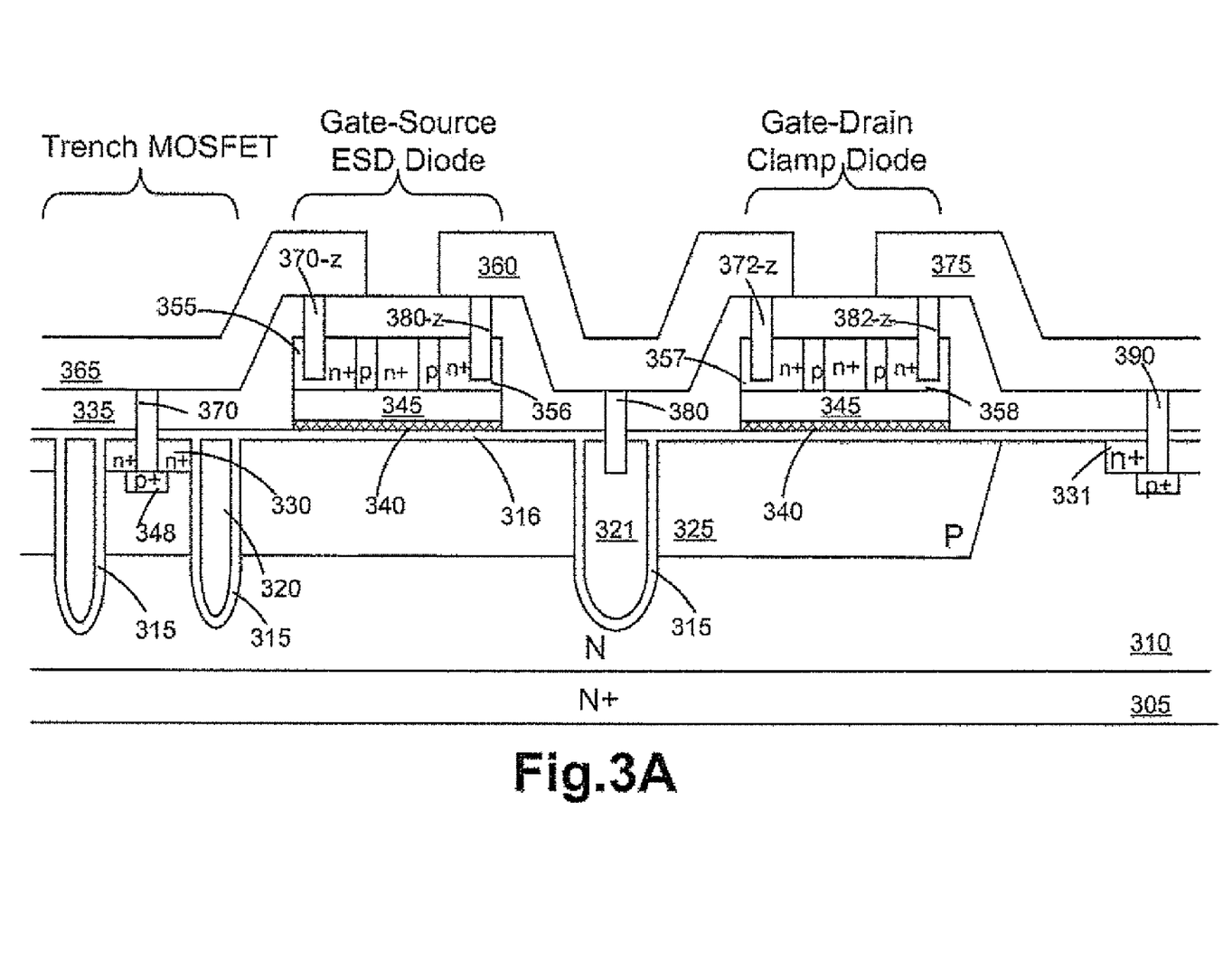
FIG. 3A is a side cross-sectional view of a trench MOSFET integrated with a Gate-Source ESD diode and Gate-Drain clamp diode according to another preferred embodiment of this invention.

Please refer to FIG. 3A for another preferred embodiment with a Nitride layer 340 according to the present invention. The trench MOSFET is formed on an N+ substrate 305 onto which grown an N epitaxial layer 310 with a lower concentration than the N+ substrate 305. A plurality of gate trenches and at least a wider gate trench for gate connection are etched into the N epitaxial layer 310. A doped poly-silicon layer is filled within those gate trenches over a gate oxide layer 315 to serve as a plurality of trenched gates 320 and at least a wider trenched gate 321 for gate connection. P-body regions 325 are extending between every two of the adjacent trenched gates 320 and 321 with an N+ source regions 330 formed near its top surface within an active area. Onto a thin oxide layer 316 along the top surface of N epitaxial layer 310, the inventive Nitride layer 340 and a thick oxide layer 345 is formed successively, and a Gate-Source ESD diode composed of alternating n+pn+pn+ doped poly-silicon regions is formed onto the thick oxide layer 345. Through a thick oxide interlayer 335 covering the thin oxide layer 316, the outer surface of the Gate-Source ESD diode, the thick oxide layer 345 and the Nitride layer 340, a plurality of contact trenches are etched into the N source region 330, the P body regions 325, one electrode 355 of the Gate-Source ESD diode, another electrode 356 of the Gate-Source ESD diode, and the wider trenched gate 321, respectively. Those contact trenches are filled with Tungsten plugs over a barrier layer of Ti/TiN or Co/TiN to act as trenched source-body contacts 370, trenched Gate-Source ESD diode electrode contacts 370-z and 380-z, and trenched gate contact 380, respectively. Via those trenched contacts, the N source region 330 and the P body regions 325 as well as the electrode 355 of the Gate-Source ESD diode are connected with a source metal 365; the wider trenched gate 321 and the another electrode 356 of the Gate-Source ESD diode are connected with a gate metal 360. Especially, underneath each bottom of the trenched source-body contacts 370, there is a p+ area 348 to further reduce the contact resistance. Besides, a Gate-Drain clamp diode composed of alternating n+pn+pn+ doped poly-silicon regions is formed onto the thick oxide layer 345. Through the thick oxide interlayer 335, the outer surface of the Gate-Drain Clamp diode, the thick oxide layer 345 and the Nitride layer 340, a plurality of contact trenches are etched through a drain region 331 and extended into the N epitaxial layer 310, one electrode 357 of the Gate-Drain clamp diode and another electrode 358 of the Gate-Drain clamp diode, respectively. Those contact trenches are filled with the Tungsten plugs over a barrier layer of Ti/TiN or Co/TiN to act as a trenched drain contact 390, trenched Gate-Drain clamp diode electrode contacts 372-z and 382-z, respectively. Via those trenched contacts, the drain region 331 and the electrode 358 of the Gate-Drain clamp diode are connected with a drain metal 375; the wider trenched gate 321 and the another electrode 357 of the Gate-Drain clamp diode are connected with the gate metal 360.

Figure 3B:
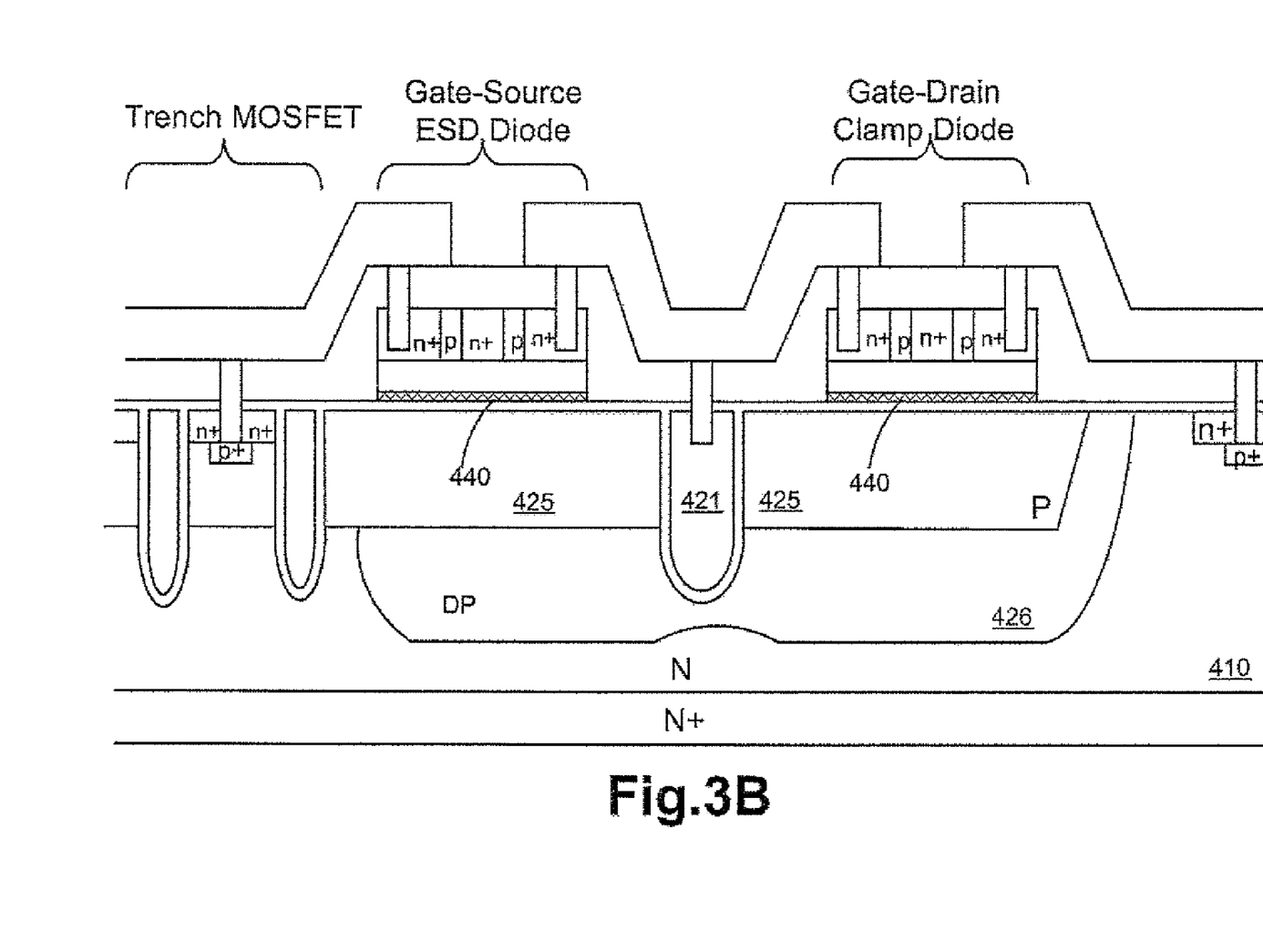
FIG. 3B is a side cross-sectional view of a trench MOSFET integrated with a Gate-Source ESD diode and Gate-Drain clamp diode having a deep body region underneath according to another preferred embodiment of this invention.

Please refer to FIG. 3B for another preferred embodiment with a Nitride layer 440 according to the present invention, which has a similar configuration to FIG. 3A, except that, in FIG. 4A, a deep body (DP, as illustrated in FIG. 3B) region 426 having junction depth deeper than the P body region 425 is formed in the N epitaxial layer 410, underneath the Gate-Source ESD diode, the Gate-Drain clamp diode, and the wider trenched gate 421 as well as wherein the deep body region 426 has overlap with the P body region 425. The deep body region 426 wraps around the P body region 425 in termination area for breakdown voltage enhancement.

The invention is also applied to trench IGBTs (Insulated Gate Bipolar Transistors) including punch-through (PT) type IGBT and non-punch-through (NPT) IGBT. Please refer to FIG. 4 for another preferred embodiment with a Nitride layer 540 according to the present invention. The trench IGBT is formed on a P+ substrate 500 onto which grown a first N+ epitaxial layer 505, and a second N epitaxial layer 510 with a lower doping concentration than the first N+ epitaxial layer 505. A plurality of gate trenches and at least a wider gate trench for gate connection are etched into the second N epitaxial layer 510. A doped poly-silicon layer is filled within those gate trenches over a gate oxide layer 515 to serve as a plurality of trenched gates 520 and at least a wider trenched gate 521 for gate connection. P-base (or body, similarly hereinafter) regions 525 are extending between every two of the adjacent trenched gates 520 and 521 with an N+ emitter (or source, similarly hereinafter) regions 530 formed near its top surface within an active area. Onto a thin oxide layer 516 along the top surface of the second N epitaxial layer 510, the inventive Nitride layer 540 and a thick oxide layer 545 is formed successively, and a Gate-Emitter (or Gate-Source, similarly hereinafter) ESD diode composed of alternating n+pn+pn+ doped poly-silicon regions is formed onto the thick oxide layer 545. Through a thick oxide interlayer 535 covering the thin oxide layer 516, the outer surface of the Gate-Emitter ESD diode, the thick oxide layer 545 and the Nitride layer 540, a plurality of contact trenches are etched into the N emitter regions 530, the P base regions 525, one electrode 555 of the Gate-Emitter ESD diode, another electrode 556 of the Gate-Emitter ESD diode, and the wider trenched gate 521, respectively. Those contact trenches are filled with Tungsten plugs over a barrier layer of Ti/TiN or Co/TiN to act as trenched emitter-base contacts 570, trenched Gate-Emitter ESD diode electrode contacts 570-z and 580-z, and a trenched gate contact 580, respectively. Via those trenched contacts, the N emitter regions 530 and the P base regions 525 and the electrode 555 of the Gate-Emitter ESD diode are connected with an Emitter metal 565; the wider trenched gate 521 and the another electrode 556 of the Gate-Emitter ESD diode are connected with a gate metal 560. Especially, underneath each bottom of the trenched emitter-base contacts 570, there is a p+ area 548 to further reduce the contact resistance. A Gate-Collector (or Gate-Drain, similarly hereinafter) clamp diode composed of alternating n+pn+pn+ doped poly-silicon regions is formed onto the thick oxide layer 545. Through the thick oxide interlayer 535, the outer surface of the Gate-Collector Clamp diode, the thick oxide layer 545 and the Nitride layer 540, a plurality of contact trenches are etched through a collector (or Drain, similarly hereinafter) regions 531 and extended into the second N epitaxial layer 510, one electrode 557 of the Gate-Collector clamp diode, another electrode 558 of the Gate-Collector clamp diode, respectively. Those contact trenches are filled with the Tungsten plugs over a barrier layer of Ti/TiN or Co/TiN to act as a trenched collector contact 590, trenched Gate-Collector clamp diode electrode contacts 572-z and 582-z, respectively. Via those trenched contacts, the collector region 531 and the electrode 558 of the Gate-Collector clamp diode are connected with a collector metal 575; the wider trenched gate 521 and the another electrode 557 of the Gate-collector clamp diode are connected with the gate metal 560. A deep base (DP, as illustrated in FIG. 4) region 526 having junction depth deeper than the P base region 525 is formed underneath the Gate-Emitter ESD diode, the Gate-Collector clamp diode, and the wider trenched gate 521 as well as wherein the deep base region 526 has overlap with the P base region 525. The deep base region 526 wraps around the P base region 525 in the termination area for breakdown voltage enhancement.

Figure 5:
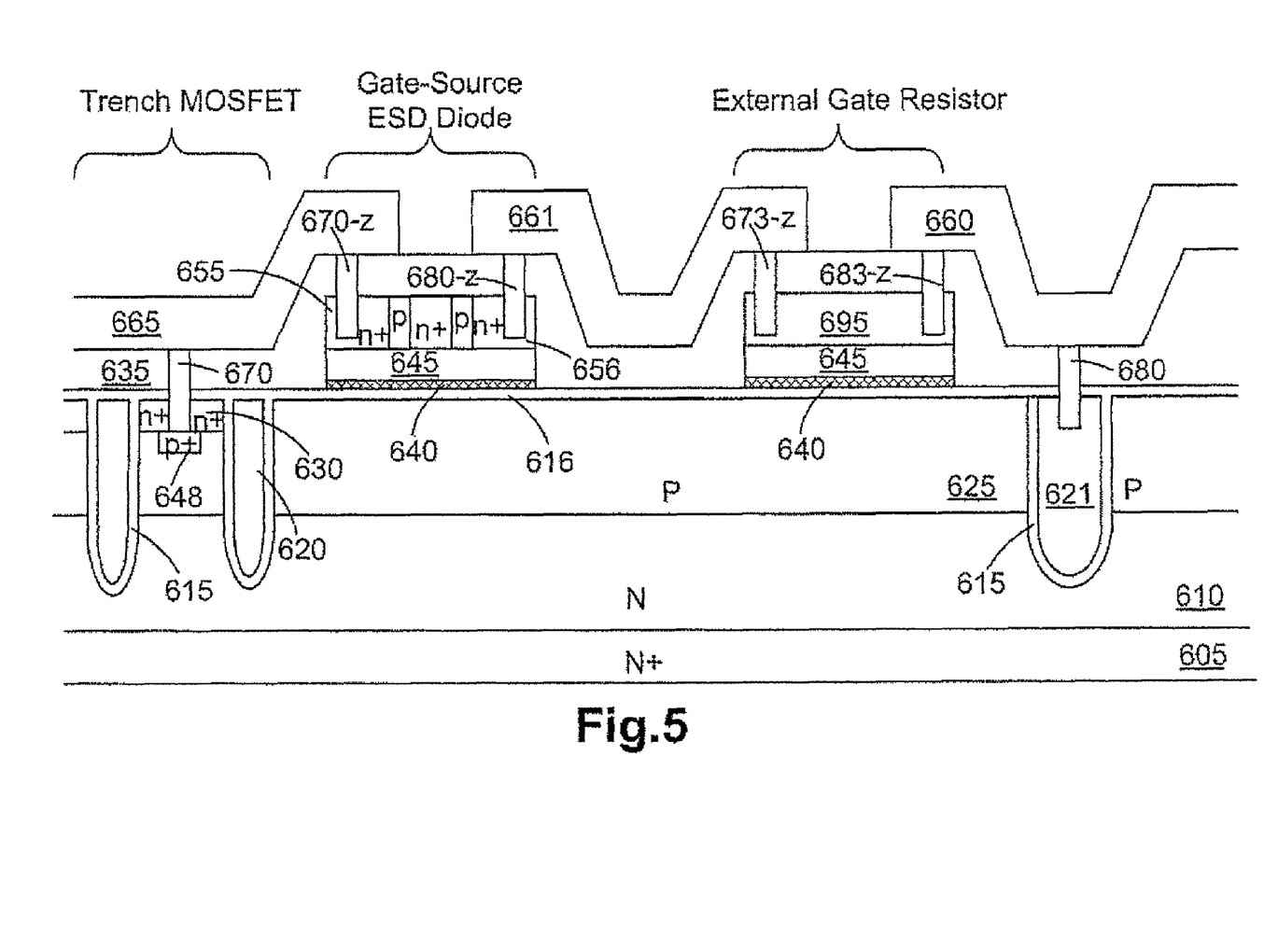
FIG. 5 is a side cross-sectional view of a trench MOSFET integrated with a doped poly-silicon resistor according to another preferred embodiment of this invention.

Please refer to FIG. 5 for another preferred embodiment with a Nitride layer 640 according to the present invention. The trench MOSFET is formed on an N+ substrate 605 onto which grown an N epitaxial layer 610 with a lower concentration than the N+ substrate 605. A plurality of gate trenches and at least a wider gate trench for gate connection are etched into the N epitaxial layer 610. A doped poly-silicon layer is filled within those gate trenches over a gate oxide layer 615 to serve as a plurality of trenched gates 620 and at least a wider trenched gate 621 for gate connection. P-body regions 625 are extending between every two of the adjacent trenched gates 620 and 621 with an N+ source region 630 formed near its top surface within an active area. Onto a thin oxide layer 616 along the top surface of N epitaxial layer 610, the inventive Nitride layer 640 and a thick oxide layer 645 is formed successively. A Gate-Source ESD diode composed of alternating n+pn+pn+ doped poly-silicon regions and a doped poly-silicon resistor 695 having either N type or P type conductivity are formed onto the thick oxide layer 645. Through a thick oxide interlayer 635 covering the thin oxide layer 616, the outer surface of the Gate-Source ESD diode, the doped poly-silicon resistor 695 and the thick oxide layer 645 as well as the Nitride layer 640, a plurality of contact trenches are etched into the N source region 630, the P body regions 625, one electrode 655 of the Gate-Source ESD diode, another electrode 656 of the Gate-Source ESD diode, the wider trenched gate 621, and two electrodes of the doped poly-silicon resistor 695, respectively. Those contact trenches are filled with Tungsten plugs over a barrier layer of Ti/TiN or Co/TiN to act as trenched source-body contacts 670, trenched Gate-Source ESD diode electrode contacts 670-z and 680-z, a trenched gate contact 680 and trenched resistor contracts 673-z and 683-z, respectively. Via those trenched contacts, the N source region 630 and the P body regions 625 and the electrode 655 of the Gate-Source ESD diode are connected with a source metal 665; the another electrode 656 of the Gate-Source ESD diode and one electrode of the doped poly-silicon resistor 695 are connected with a first gate metal 661; the wider trenched gate 621 and another electrode of the doped poly-silicon resistor 695 are connected with a second gate metal 660. Especially, underneath each bottom of the trenched source-body contacts 670, there is a p+ area 648 to further reduce the contact resistance.

Figure 6A:
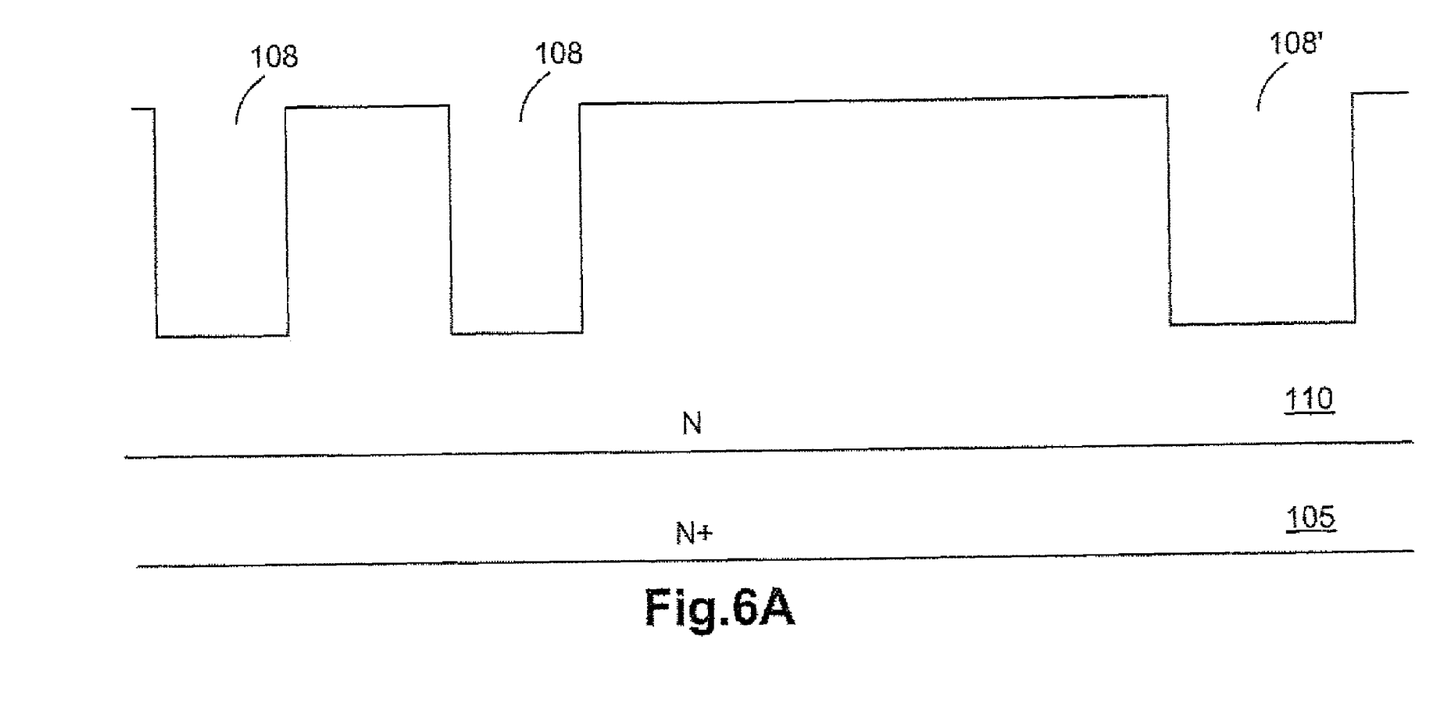
FIGS. 6A to 6G are a serial of side cross-sectional views for showing the process steps for fabricating a semiconductor device as shown in FIG. 2A.
Figure 6B:
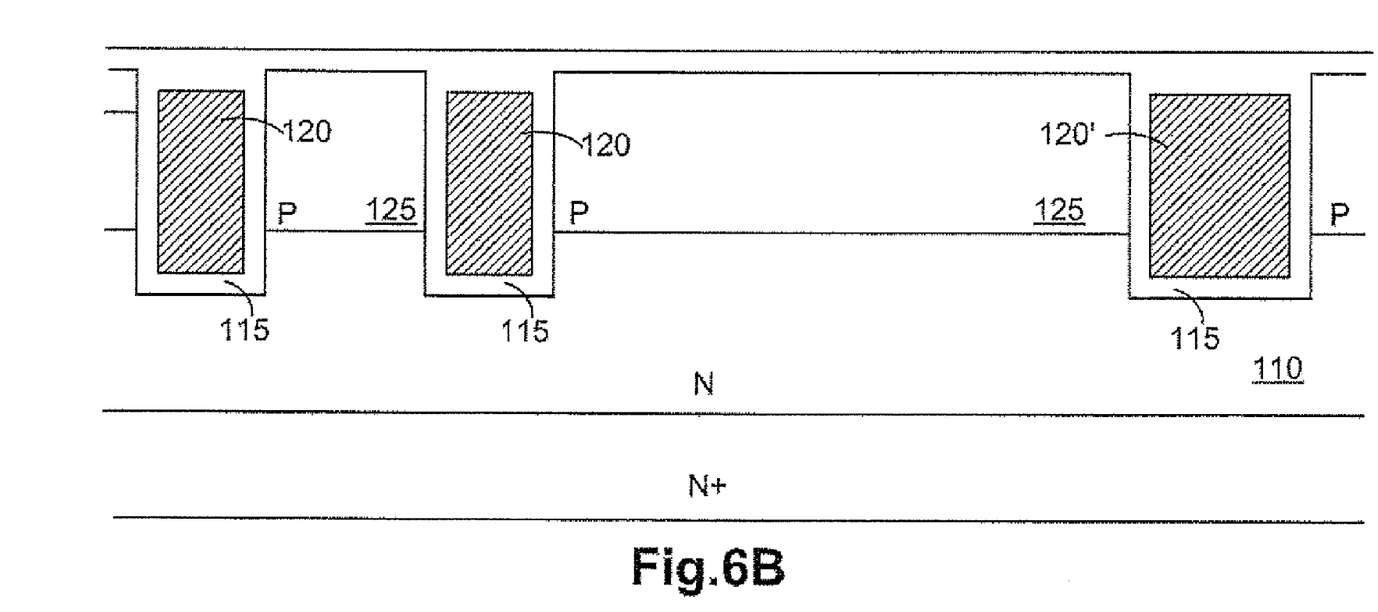
Figure 6C:
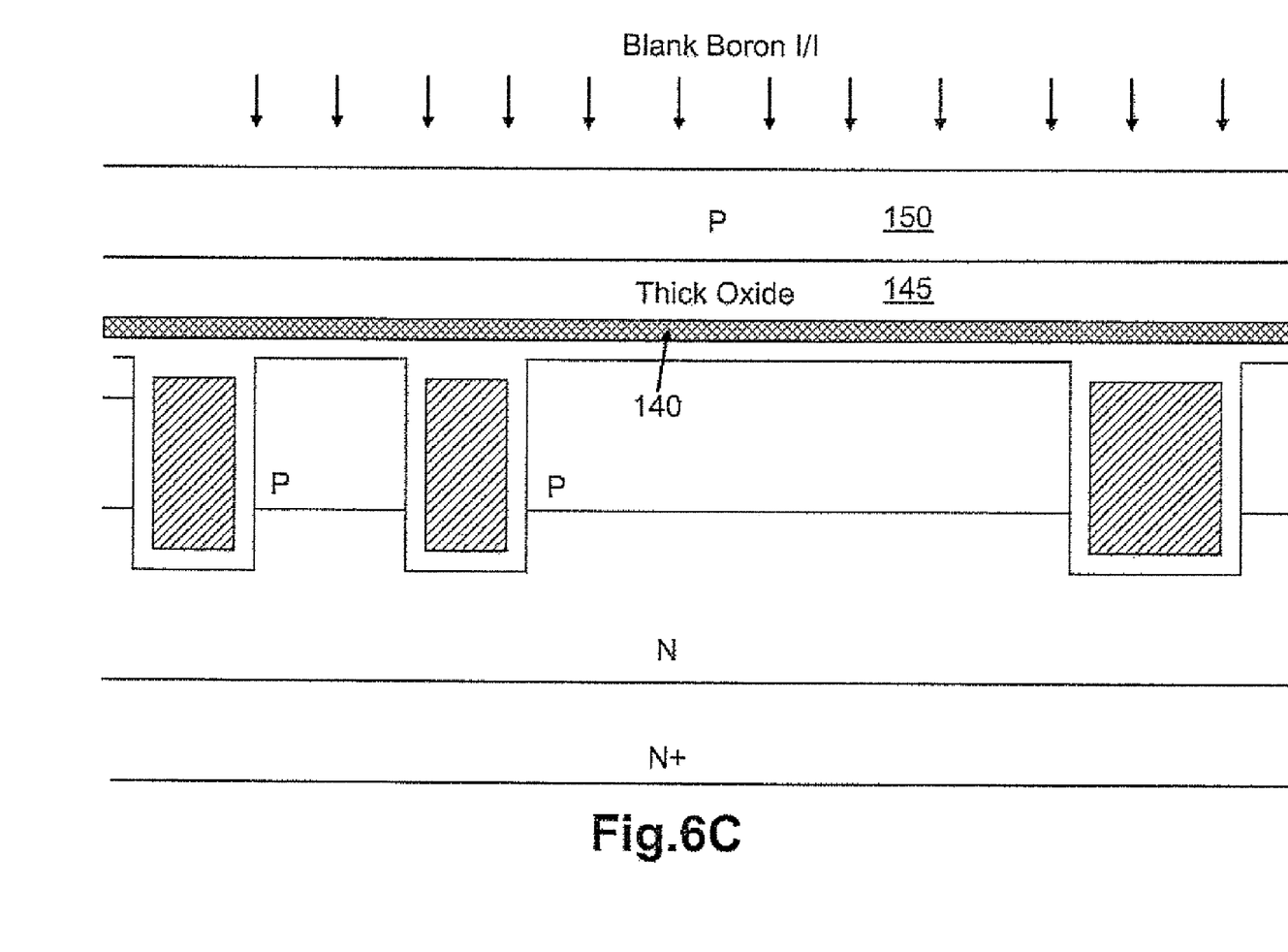
Figure 6D:
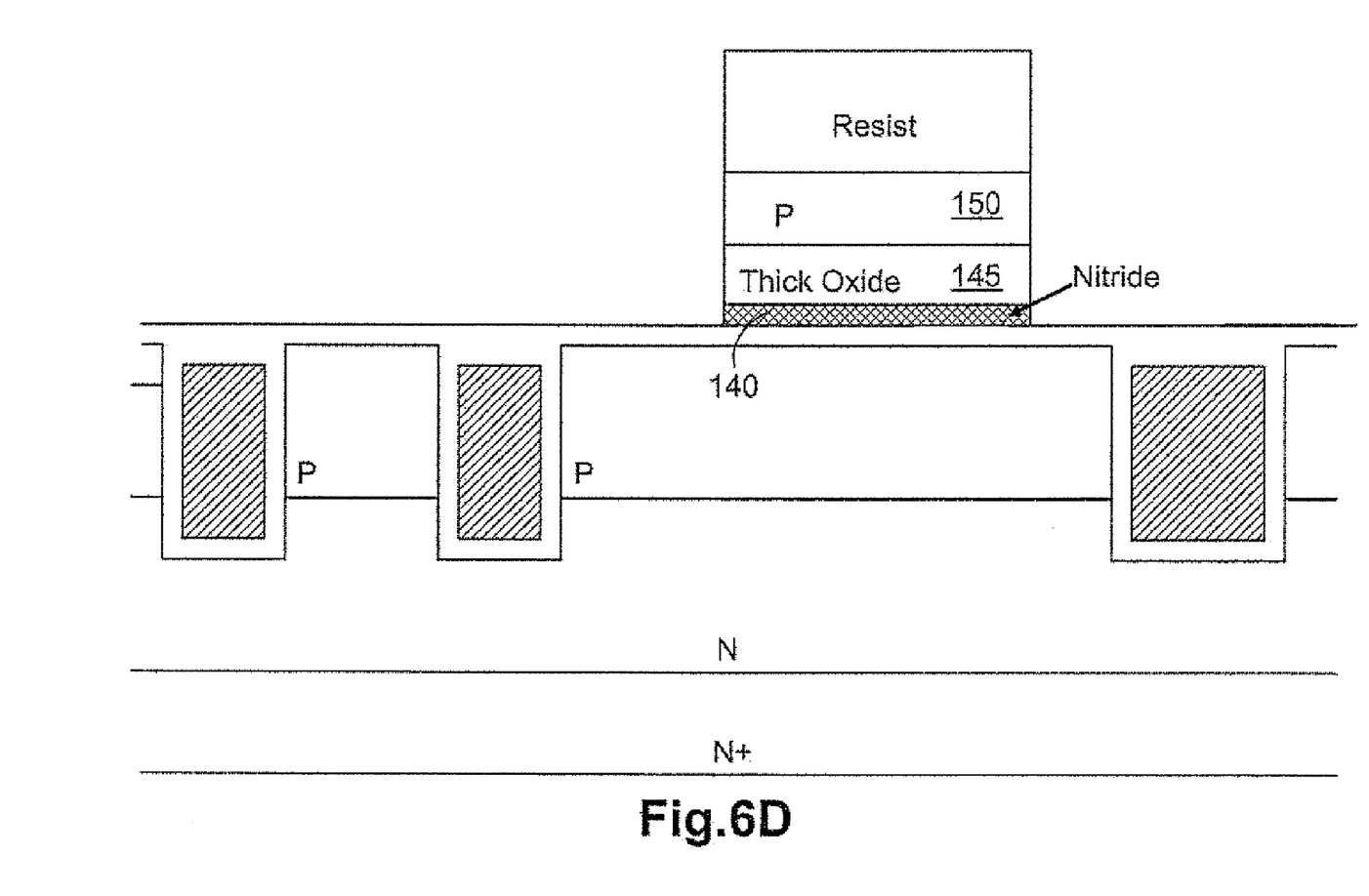

Please refer to FIGS. 6A to 6G for a serial of side cross-sectional views to illustrate the fabricating steps of the semiconductor power device cell shown in FIG. 2A. In FIG. 6A, a trench mask (not shown) is applied to open a plurality of gate trenches 108 an at least a wider gate trench 108' for gate connection in an N epitaxial layer 110 supported on a N+ substrate 105 by employing a dry silicon etch process. In FIG. 6B, all those gate trenches are oxidized with a sacrificial oxide (not shown) to eliminate the plasma damage during the process of opening those gate trenches by removing the sacrificial oxide. Then a gate oxide layer 115 is grown followed by depositing a doped poly-silicon layer to fill those gate trenches. The filling-in doped poly-silicon is then etched back or CMP (Chemical Mechanical Polishing) to form trenched gates 120 and at least a wider trenched gate 120' for gate connection. Next, the manufacturing process proceeds with a P-body implantation with a P-type dopant ion implantation and an elevated temperature is applied to diffuse the P-body 125 into the N epitaxial layer 110.

In FIG. 6C, the process continues in turn with the deposition of a Nitride layer 140 and a thick oxide layer 145. The thickness of the nitride layer 140 ranges from 500 to 2000 angstroms and the thick oxide layer 145 is greater than 1000 angstroms. Then, a poly-silicon layer 150 is deposited on top of the thick oxide layer 145 followed by a p-type dopant ion implantation with a blank Boron ion. In FIG. 6D, a photo resist is applied as a poly-silicon mask to etch the P type poly silicon 150, the thick oxide layer 145 and the Nitride layer 140 by successively oxide etch, dry oxide etch and Nitride etch process.

Figure 6E:
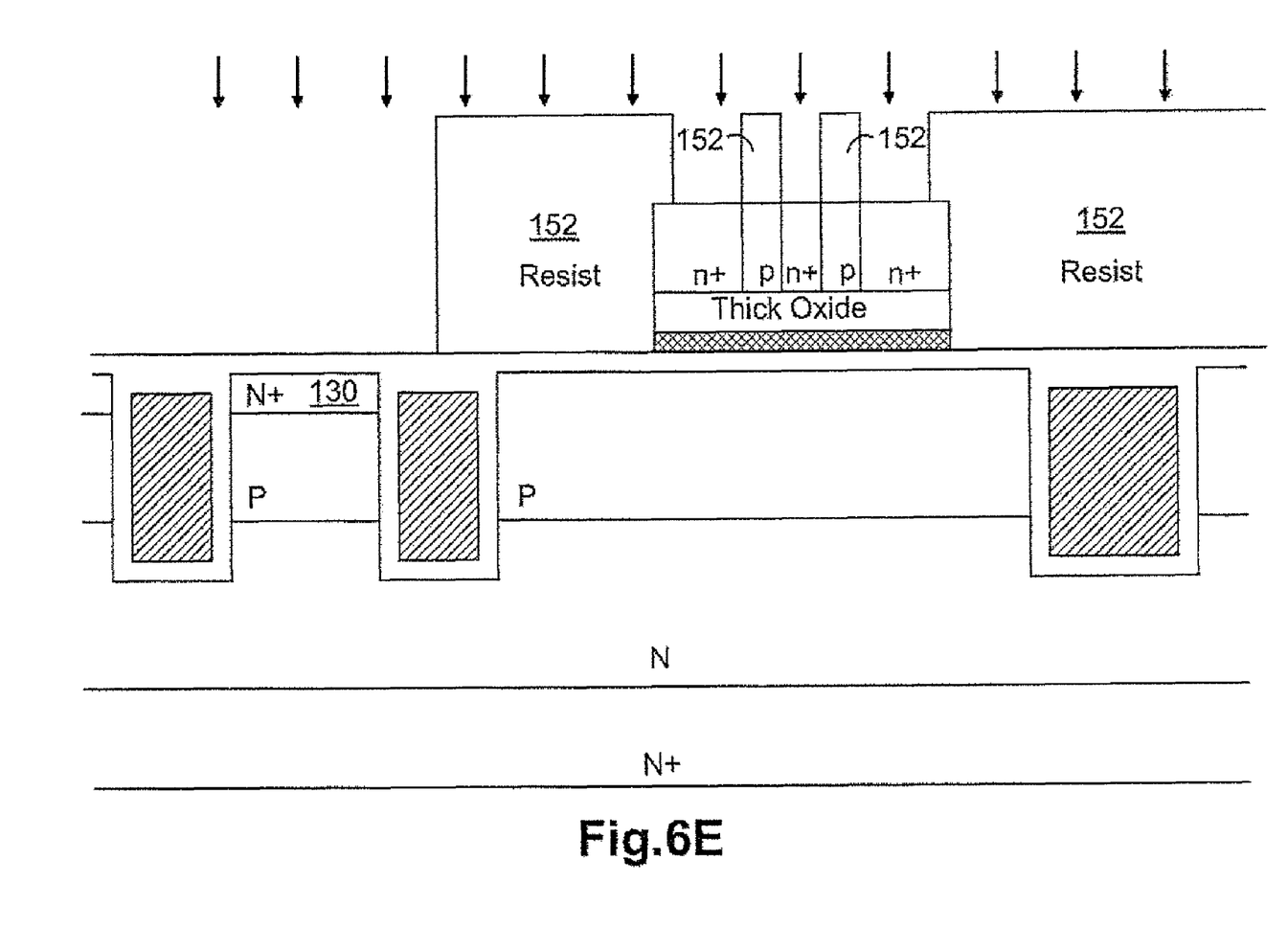
Figure 6F:
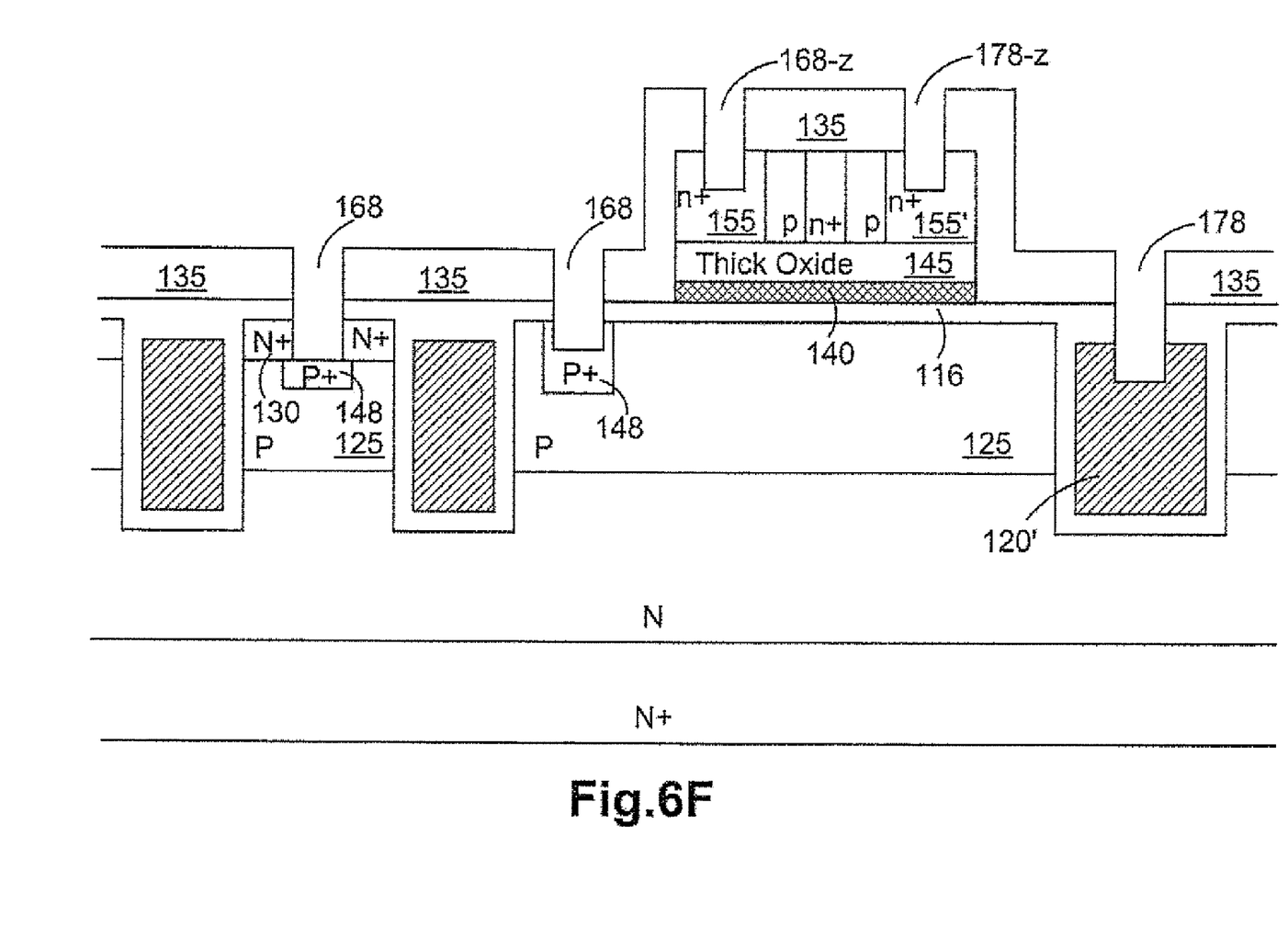
Figure 6G:
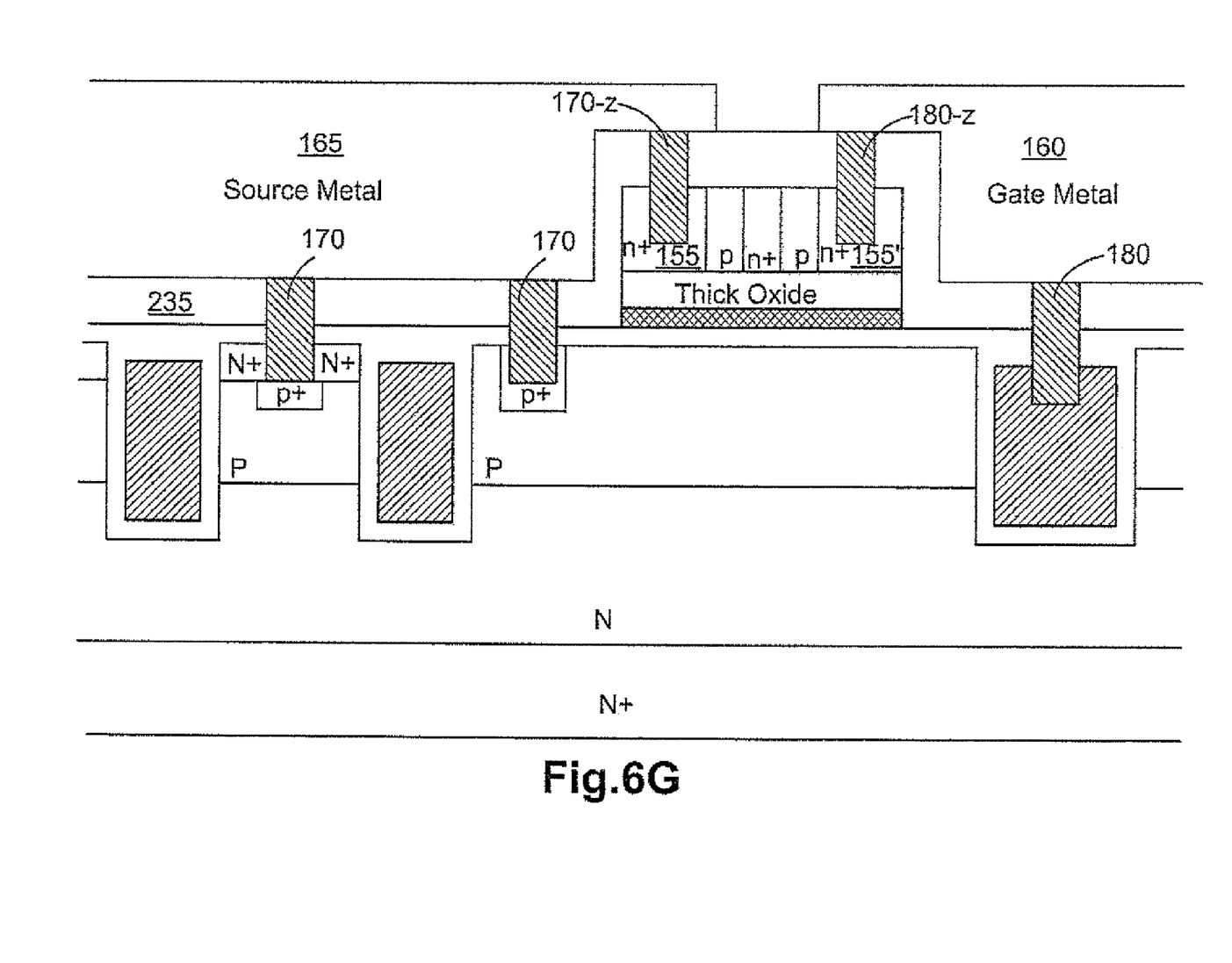

In FIG. 6E, after the removal of photo resist in FIG. 6D, another photo resist 152 is employed as the source mask. Then, above the top surface of whole device, an Arsenic or Phosphorus ion implantation is carried out to form an N+ source region 130 and the n+ doped regions of a Gate-Source ESD diode. In FIG. 6F, a thick oxide interlayer 135 is deposited covering a thin oxide layer 116, the outer surface of the Gate-Source ESD diode, the thick oxide 145 and the Nitride layer 140. Then, onto the thick oxide interlayer 135, a contact mask (not shown) is applied to open a plurality of contact trenches. Within these contact trenches, contact trenches 168 are etched into the N+ source region 130 and the P body regions 125, contact trench 168-z is etched into one electrode 155 of the Gate-Source ESD diode, contact trench 178-z is etched into another electrode 155' of the Gate-Source ESD diode and contact trench 178 is etched into the wider trenched gate 120'. Then, a Boron ion implantation is carried out to form a p+ area 148 underneath each bottom of the contact trenches 168. In FIG. 6G, a tungsten plugs are filled into each the contact trench after the deposition of a barrier layer composed of Ti/TiN or Co/TiN along the inner surface of contact trenches and then etched back or CMP to form trenched source-body contacts 170, trenched Gate-Source ESD diode electrode contact 170-z and 180-z, and a trenched gate contact 180. Next, a front metal layer is deposited and then patterned by a metal mask (not shown) to form a source metal 165 and a gate metal 160 by metal etch. The source metal 165 is connected with the N source region 130, the P body regions 125 and the electrode 155 of the Gate-Source ESD diode via the trenched source-body contacts 170 and the trenched Gate-Source ESD diode electrode contact 170-z, respectively. The gate metal 160 is connected with the wider trenched gate 120' and the another electrode 155' of the Gate-Source ESD diode via the trenched gate contact 180 and the trenched Gate-Source ESD diode electrode contact 180-z, respectively.

The device structures as shown in FIGS. 3A and 5 can be manufactured with the same process flow as described in FIGS. 6A to 6G while the device structures as shown in FIGS. 3B and 4 with adding a deep body formation step into the process flow.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device comprising a Gate-Source ESD (electrostatic discharge) diode integrated with a doped poly-silicon resistor for providing gate-source ESD protection, said semiconductor power device further comprising:
an insulation oxide layer comprising a separately formed thick oxide layer on top of a Nitride layer and a thin oxide layer for completely insulating said Gate-Source ESD diode and said doped poly-silicon resistor from a body region, said Nitride layer sandwiched between said thick oxide layer and said thin oxide layer functioning as dry oxide etching stopper for preventing said body region from damage during dry oxide etching process.

2. The semiconductor power device of claim 1, wherein said Gate-Source ESD diode further comprising multiple doped poly-silicon regions with alternating N type and P type regions.

3. The semiconductor power device of claim 1, wherein said doped poly-silicon resistor being doped with N type conductivity.

4. The semiconductor power device of claim 1, wherein said doped poly-silicon resistor being doped with P type conductivity.

5. The semiconductor power device of claim 1, wherein said Nitride layer having a thickness from 500 to 2000 angstroms.

6. The semiconductor power device of claim 1, wherein said thick oxide layer having a thickness greater than 1000 angstroms.

* * * * *